United States Patent [19]
Fattaruso et al.

[11] Patent Number: 6,127,957
[45] Date of Patent: Oct. 3, 2000

[54] DATA CONVERTER WITH HORIZONTAL DIFFUSION RESISTOR MEANDER

[75] Inventors: John W. Fattaruso, Dallas, Tex.; Shivaling S Mahant-Shetti, Kamataka; Debapriya Sahu, Bangalore, both of India

[73] Assignee: Texas Instruments Incorporated, Dallas, Tex.

[21] Appl. No.: 09/342,877

[22] Filed: Jun. 29, 1999

[51] Int. Cl.[7] .................................................... H03M 1/68
[52] U.S. Cl. .............................................................. 341/154
[58] Field of Search ................................... 341/154, 145, 341/148, 156

[56] References Cited

U.S. PATENT DOCUMENTS 5,999,115  12/1999  Connell et al. ........................ 341/145
6,037,889   3/2000  Knee ...................................... 341/154

*Primary Examiner*—Brian Young
*Attorney, Agent, or Firm*—Ronald O. Neerings; Robby T. Holland; Frederick J. Telecky, Jr.

[57] ABSTRACT

A data converter (20) comprising an input ($I_0'$–$I_3'$) for receiving a digital word and an output ($V_{OUT2}$) for providing an analog voltage level in response to the digital word. The data converter further comprises a plurality of bit lines (BL0'–BL3') formed with an alignment in a first dimension and a plurality of word lines formed (WL0'–WL3') with an alignment in a second dimension different than the first dimension. Still further, the data converter comprises a string (12') comprising a plurality of series connected resistive elements (R10–R24) and a plurality of voltage taps (T10–T25), where at least a majority of the plurality of series connected resistive elements are formed with an alignment in the second dimension. Lastly, the data converter comprises a plurality of switching transistors (ST10–ST25) coupled between the plurality of voltage taps and the output. Responsive to at least a portion of the digital word, selected ones of the switching transistors are operable to receive a gate bias to enable a corresponding switching transistor to provide a conductive path from a corresponding one of the voltage taps toward one of the plurality of bit lines and further toward the output.

21 Claims, 3 Drawing Sheets

6,127,957

DATA CONVERTER WITH HORIZONTAL DIFFUSION RESISTOR MEANDER

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to data converters, and are more particularly directed to converters using resistor strings.

Data converters may be used in various types of electronic circuits, or may be formed as a single integrated circuit device. Such converters typically take one of two forms, either as a digital-to-analog converter ("DAC") or an analog-to-digital converter ("ADC"). For the DAC, its operation converts an input digital signal to an output analog signal, typically where the amplitude of the output analog signal corresponds directly to the magnitude of the input digital signal. Conversely, the ADC converts an input analog signal to an output digital signal, typically where the value of the output digital signal corresponds directly to the amplitude of the input analog signal. In many configurations, both DACs and ADCs implement a resistor string that includes a number of series-connected resistors, where each resistor provides a voltage tap at each of its ends. Typically, the overall string is biased at opposing ends by two different reference voltages, where for example one such voltage is a positive voltage and the other is ground. Also in this regard, in an effort to maintain the linearity between the digital input and the analog output, a common concern in the art is to endeavor to ensure that each resistor in the string has as close to the same resistance value as all other resistors in the string. Accordingly, the resistor string forms a series voltage dividing network and each of the voltage taps is accessible as part of the operation for the data conversion (i.e., either from digital to analog, or analog to digital).

For further background to converters and by way of example, FIG. 1 illustrates a typical configuration of a prior art DAC 10, and is detailed briefly below. In addition, since the primary focus of the preferred embodiments described later is directed to resistor strings as used in either a DAC or an ADC, the following discussion provides one example of such a string as used in a DAC, but is not unduly lengthened by also providing a detailed analysis of an ADC. Instead, such an understanding is left to one skilled in the art.

FIG. 1 illustrates a typical configuration of a prior art DAC 10, and is detailed briefly here with additional detail ascertainable by one skilled in the art. By way of example and as appreciated later, DAC 10 is a 4-input 16-output DAC, while numerous other dimensions may exist for different DAC configurations. In general and as detailed below, DAC 10 is operable to receive a 4-bit input word, designated from least significant bit to most significant bit as $I_0$–$I_3$, and in response to the magnitude of that input to output a corresponding analog voltage. Before detailing this operation, it is first instructive to examine the devices and connections of DAC 10. In this regard, DAC 10 includes a series-connected resistor string designated generally at 12, and which forms a meander in that it serpentines back and forth. Additionally, DAC 10 is generally an array in nature, having a number of bit lines in the vertical dimension and a number of word lines in the horizontal dimension. Since the example of DAC 10 presents a 4-input 16-output DAC, the array of DAC 10 includes four bit lines BL0 through BL3, and four word lines WL0 through WL3. Also for the current example of a 4-to-16 DAC, resistor string 12 includes fifteen resistive elements R0 through R14 formed in the horizontal dimension. Resistive elements R0 through R14 may be formed using various techniques as discussed in greater detail later, where regardless of the technique used to form the resistive elements ideally each resistive element has as close to the same resistance value as all other resistors in the string. Moreover, a voltage source $V_{REF1}$ is applied across resistor string 12, and may be of any suitable biasing voltage, which for current applications is typically on the order of 2.0 volts. For DAC 10, string 12 is biased between $V_{REF1}$ and ground, but it should be understood that in other configurations two different non-ground potentials may be connected at opposing ends of string 12. When ground is connected to one end of the string, it is easily appreciated that this difference of the potentials at the ends of the string equals $V_{REF1}$. In any event, given the equal resistance of each element in the string, $V_{REF1}$ is uniformly divided across the resistive elements of string 12.

Looking to the detailed connections with respect to resistive elements R0 through R14, each resistive element provides two taps from which a voltage may be measured as detailed below. For example, looking to resistive element R0, it provides a tap T0 and a tap T1, while resistive element R1 shares the same tap T1 and provides another tap T2, and so forth. Each tap has a switching device connected between it and a corresponding output bit line. In the current example, each of these switching devices is an n-channel field effect transistor, and is labeled for convenience by combining the abbreviation ST (i.e., switching transistor) with the same numeric identifier corresponding to the tap to which a source/drain of the transistor is connected. For example, a source/drain of transistor ST0 is connected to tap T0, a source/drain of transistor ST1 is connected to tap T1, and so forth. Further, the switching transistors are arranged so that a like number of taps are coupled via corresponding switching transistors to a corresponding one of the bit lines. In the current example of DAC 10, four taps are coupled in this manner to a corresponding bit line. For example, taps T0 through T3 are coupled, via corresponding switching transistors ST0 through ST3, to bit line BL0. As another example, taps T4 through T7 are coupled, via corresponding switching transistors ST4 through ST7, to bit line BL1. Each bit line BL0 through BL3 is coupled via a respective column access transistor, CAT0 through CAT3, to a column decoder 14. More particularly and for reasons evident below, column decoder 14 is coupled to receive the two most significant bits (MSBs) of the 4-bit word input to DAC 10, and in response column decoder 14 controls the gates of column access transistors CAT0 through CAT3. Lastly, it should be understood that column decoder 14 operates in response to an overall system supply voltage $V_{S1}$ which in the prior art is typically on the order of 5.0 volts.

Returning now to switching transistors ST0 through ST15, and given the array nature of DAC 10, it is further appreciated that the switching transistors are arranged so that a like number of switching transistors are controlled, via connection to their gates, by a corresponding word line which is further connected to row decoder 16. Like column decoder 14, row decoder 16 is also responsive to the system supply voltage $V_{S1}$. Returning to the connectivity between row decoder 16 and the switching transistors, and given the current example of DAC 10, the gates of four switching transistors are coupled to each corresponding word line. For example, the gates of switching transistors ST0, ST7, ST8, and ST15 are coupled to word line WL0. As another example, the gates of switching transistors ST1, ST6, ST9, and ST14 are coupled to word line WL1. Lastly in this regard, and for reasons evident below, row decoder 16 is coupled to receive the two least significant bits (LSBs) of the 4-bit word input to DAC 10 (i.e., bits $I_1$ and $I_0$), and is also controlled in response to the least significant bit ("lsb"), $I_2$, of the two MSBs input to column decoder 14. More particularly, each least significant bit $I_0$ and $I_1$ is coupled as an input to a corresponding exclusive OR gate EOG0 and EOG1 as a first input, while the second input of exclusive OR gates EOG0 and EOG1 is connected to receive $I_2$ (i.e., the least significant bit of the two MSBs input to column decoder 14). In response to these bits, row decoder 16 controls the gates of switching transistors ST0 through ST15 as detailed below.

The operation of DAC 10 is now described, first in general and then more specifically through the use of a few examples. A 4-bit digital word is connected to inputs $I_0$ through $I_3$ and ultimately causes signals to pass to column decoder 14 and row decoder 16. Generally, row decoder 16 includes sufficient logic circuitry or the like to respond by asserting one of word lines WL0 through WL3, thereby providing an enabling voltage to the gates of the four switching transistors coupled to the asserted word line. Similarly, column decoder 14 includes sufficient logic circuitry or the like to respond by enabling one of column access transistors CAT0 through CAT3, thereby causing the enabled transistor to pass the voltage from the corresponding one of bit lines BL0 through BL3 to output $V_{OUT1}$. In a simple case, the result of the above operations may be viewed by correlating the value of the 4-bit input to one of the sixteen decimal tap numbers. For example, if the 4-bit digital word equals 0001 (i.e., decimal value one), then DAC 10 enables a switching transistor and a column access transistor to couple the voltage at tap T1 to $V_{OUT1}$.

By way of detailed illustration of the operation of DAC 10, the example of an input equal to 0001 is now traced through DAC 10 in greater detail. From the input of 0001, its two MSBs are coupled to column decoder 14 and, thus, the value of 00 is received by column decoder 14. In response, column decoder 14 enables the gate of the column access transistor having a numeric identifier equal to the value of the MSBs. Here, the MSBs of 00 equal a decimal value of zero and, thus, column decoder 14 couples a voltage of $V_{S1}$ to the gate of column access transistor CAT0. Turning now to row decoder 16, it responds to the value of the two LSBs of the 4-bit input. However, note that these two LSBs pass through exclusive OR gates and, therefore, their values are unchanged when passed to row decoder 16 if the lsb equals 0, or their complements are passed to row decoder 16 if the lsb equals 1. Returning then to the example of a 4-bit input equal to 0001, the two LSBs equal 01 and the lsb of the two MSBs equals 0. Thus, the unchanged LSBs equal to 01 reach row decoder 16, and row decoder 16 in response asserts the word line having a decimal numeric identifier equal to the value of the two LSBs as received from gates EOG0 and EOG1. In the present example, therefore, row decoder 16 asserts word line WL1 high to a value of $V_{S1}$ which, therefore, enables each of switching transistors ST1, ST6, ST9, and ST14. Recall also that column decoder 14 in this example enables column access transistor CAT0. As a result, the voltage from tap T1 passes via switching transistor ST1 to bit line BL0, and then passes via column access transistor CAT0 to $V_{OUT1}$. Lastly, it is noted that the voltage at tap T1 is divided across one resistive element (i.e., R0) and, thus, for an input equal to 0001, the analog output voltage using voltage division is $1/15*V_{REF1}$.

To further illustrate in detail the operation of DAC 10, consider now the example of an input equal to 0111 as traced through DAC 10. At the outset, from the general operation described above, one skilled in the art will expect that since the decimal value of 0111 equals seven, then the tap selected by DAC 10 for output is tap T7. This expectation is now confirmed through a detailed examination of this example. From the input of 0111, its two MSBs of 01 are coupled to column decoder 14. In response, column decoder 14 enables the gate of the column access transistor having a decimal numeric identifier equal to the two MSB values of 01 and, hence, the gate of column access transistor CAT1 is enabled. Turning now to row decoder 16, note first that the lsb of the two MSBs in this example equals one; consequently, gates EOG0 and EOG1 cause the complements of the two LSBs to reach row decoder 16. Thus, the complements of the 11 LSBs are 00 and, therefore, the value of 00 reaches row decoder 16. In response, row decoder 16 asserts word line WL0 high since that word line has a numeric identifier equal to the value of the two complemented LSBs. When word line WL0 is asserted, it enables each of switching transistors ST0, ST7, ST8, and ST15. Recall also that column decoder 14 in his example enables column access transistor CAT1. As a result, the voltage from tap T7 passes via switching transistor ST7 to bit line BL1, and then passes via column access transistor CAT1 to output $V_{OUT1}$. Lastly, it is noted that the voltage at tap T7 is divided across seven of the fifteen resistive elements (i.e., R0 through R6) and, thus, for an input equal to 0111, the analog voltage output using voltage division is equal to $7/15*V_{REF1}$. Accordingly, the digital input of 0111 has been converted to an analog voltage which equals this divided voltage. Given this as well as the preceding example, one skilled in the art will further appreciate that with different digital inputs, any of the switching transistors of DAC 10 may be enabled along with enabling one of the column access transistors, and for each such combination of transistors there is a corresponding output which represents a divided voltage between zero volts or any value incrementing up from zero volts by $1/15 V_{REF1}$ (assuming equal resistance among the resistive elements), and up to an output equal to $V_{REF1}$.

Having detailed DAC 10, attention is now focused in greater detail to resistive elements R0 through R14. Specifically, in the prior art such elements are often formed as metal devices in an effort to achieve considerably low resistance for reasons such as achieving various device speeds. For example, a single metal resistive element may have a resistance on the order of sixty milliohms per square and may support device speeds on the order of hundreds of megahertz. However, it has been observed in connection with the present inventive embodiments that various configurations do not require such small resistance values, where such configurations may well arise in devices operating at lower frequencies. In addition, it is often the goal of an integrated circuit to be made smaller, and this goal may well apply to a DAC, either alone or in combination with other circuitry on the same single integrated circuit. However, the present inventors recognize that the relatively larger size of metal resistive elements may conflict with the goal of reducing DAC size. Indeed, the present inventors recognize as developed below in the preferred embodiments that by avoiding metal resistive elements, some of the area and complexities that accompany such devices also may be reduced or substantially eliminated. In view of these drawbacks and goals, there arises a need to provide an improved converter configuration, as is achieved by the preferred embodiments discussed below.

BRIEF SUMMARY OF THE INVENTION

In the preferred embodiment, there is a data converter comprising an input for receiving a digital word and an output for providing an analog voltage level in response to the digital word. The data converter further comprises a plurality of bit lines formed with an alignment in a first dimension and a plurality of word lines formed with an alignment in a second dimension different than the first dimension. Still further, the data converter comprises a string comprising a plurality of series connected resistive elements and a plurality of voltage taps, where at least a majority of the plurality of series connected resistive elements are formed with an alignment in the second dimension. Lastly, the data converter comprises a plurality of switching transistors coupled between the plurality of voltage taps and the output. Responsive to at least a portion of the digital word, selected ones of the switching transistors are operable to receive a gate bias to enable a corresponding switching transistor to provide a conductive path from a corresponding one of the voltage taps toward one of the plurality of bit lines and further toward the output. Other circuits, systems, and methods are also disclosed and claimed.

BRIEF DESCRIPTION OF THE SEVERAL VIEWS OF THE DRAWING

FIG. 3b illustrates a plan view of two cells from the DAC of FIG. 2, but at an earlier step in the manufacturing process than in FIG. 3a; and FIG. 3c illustrates a cross sectional view of a resistive element from FIG. 3a.

DETAILED DESCRIPTION OF THE INVENTION

Figure 1:
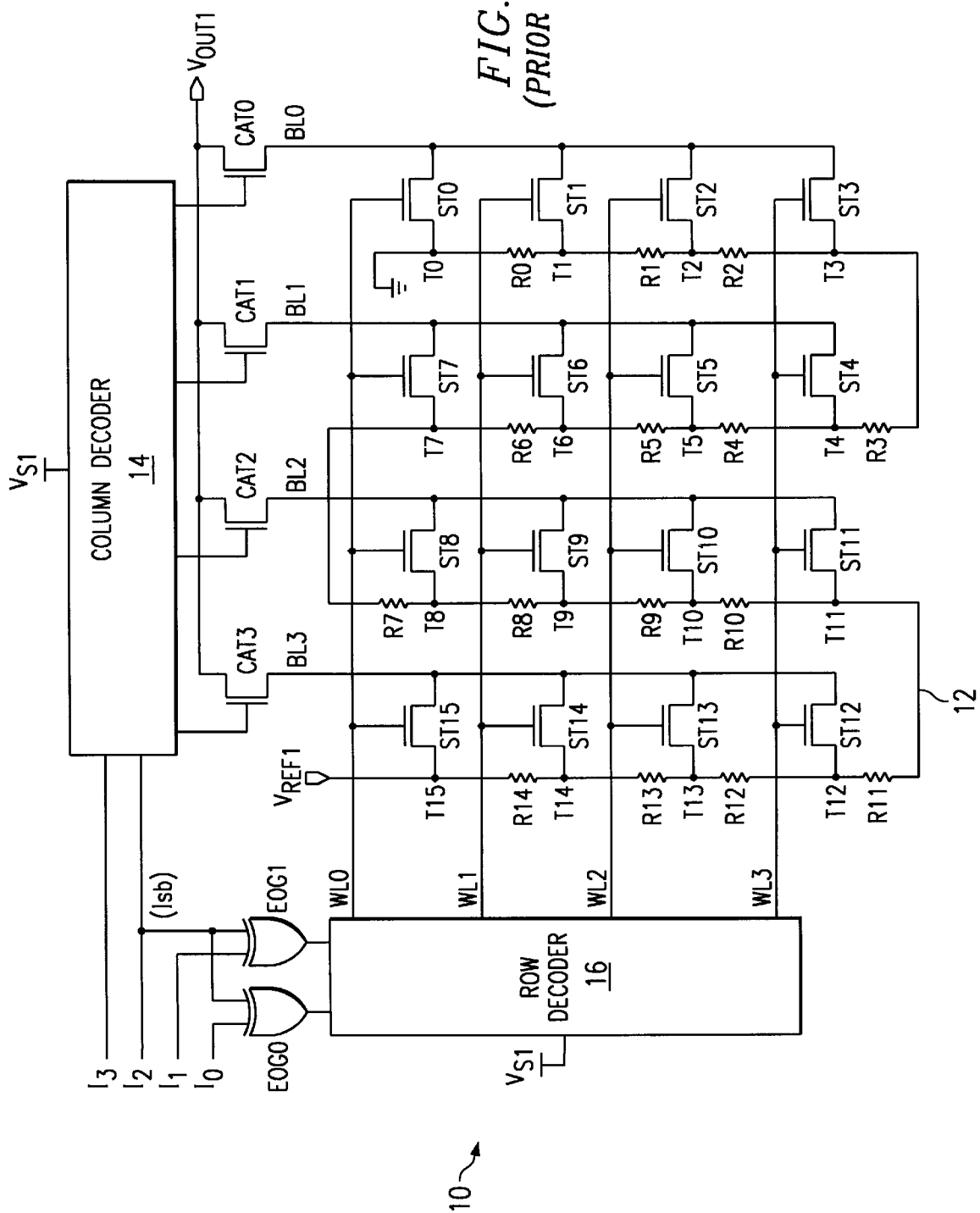
FIG. 1 illustrates a schematic of a prior art digital-to-analog converter ("DAC")

FIG. 1 was described in the preceding Background Of The Invention section of this document and in connection with the prior art.

Figure 2:
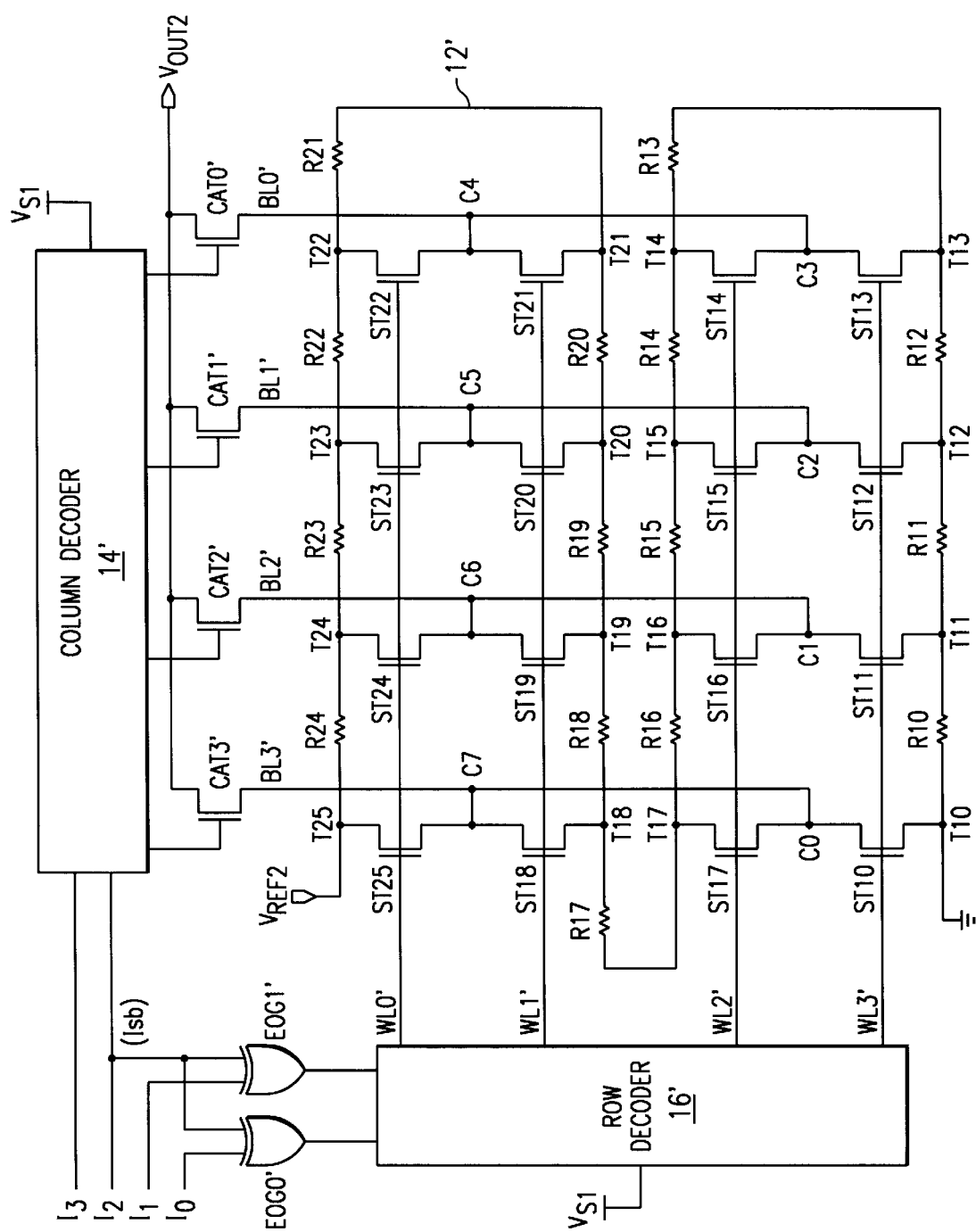
FIG. 2 illustrates a schematic of a first inventive DAC including a resistor string, where the resistive elements of the string are formed in the horizontal dimension and, hence, are orthogonal with respect to the DAC bit lines.

FIG. 2 illustrates a schematic of a DAC 20 according to a first inventive embodiment. DAC 20 includes some components that are comparable in connection and operation to components in DAC 10 of FIG. 1. To illustrate these like components, they are shown with the same reference identifiers as in FIG. 1, with the exception that an apostrophe is added to the identifier in FIG. 2. Briefly reviewing these comparable elements of DAC 20, and assuming the reader is familiar with DAC 10, DAC 20 is a 4-to-16 DAC that receives a 4-bit input word $I_0'$–$I_3'$. DAC 20 includes a series-connected resistor sting 12'; to distinguish the resistive elements in string 12' with those of the prior art, they are numbered starting arbitrarily at R10 and thus include elements R10 through R24, formed according to techniques described later and such that each element preferably has a like resistance. The ends of the resistive elements give rise to an array of corresponding taps starting with an arbitrarily numbered tap T10 and, thus, including taps T10 through T25. String 12' is biased in total by a reference voltage $V_{REF2}$. DAC 20 further includes a number of bit lines BL0' through BL3' as well as a number of word lines WL0' through WL3'. Each bit line is accessed by enabling a corresponding one of column access transistors CAT0' through CAT3', where each such column access transistor has a first source/drain connected to one corresponding bit line and a second source/drain connected to $V_{OUT2}$. More specifically, electrical access to a given tap voltage is achieved by row decoder 16' asserting a word line to enable its corresponding switching transistors, and column decoder 14' outputting an enabling signal to a gate of one of the column access transistors such that the tap voltage conducts through a switching transistor to a bit line, and then through the enabled column access transistor to an output $V_{OUT2}$.

Turning now to a first item of contrast between DAC 20 and DAC 10 of the prior art, note that the schematic illustrations of FIGS. 1 and 2 are also intended to illustrate an aspect of layout consideration as it pertains to resistive element orientation. Specifically, for DAC 20, note that most if not all of resistive elements R10 through R25 are formed in a horizontal dimension, that is, orthogonal to bit lines BL0' through BL3'. More particularly, string 12' serpentines back and forth to form a meander having a number of rows that are primarily in the horizontal dimension, with vertical portions referred to as "turns" connecting each row of resistive elements. Also in this regard, although all of the resistive elements are shown schematically in a horizontal sense in FIG. 2, note that when actually formed as detailed below a portion of those resistive elements formed as part of a turn may extend in the vertical dimension; nevertheless, since the majority of resistive elements in DAC 20 are aligned along a horizontal row rather than in a vertical turn, then consequently the majority of the resistive elements are also formed in the horizontal dimension. Indeed, in an alternative embodiment, additional connections may be formed at the turns so that all of the resistive elements are also formed in the horizontal dimension. In any event, and by way of contrast, FIG. 1 illustrates that the resistive elements R0 through R14 of DAC 10 are formed in a vertical dimension that is parallel to bit lines BL0 through BL3. This formation is one beneficial aspect of DAC 20 over the prior art in that it lends itself to a more compact design. More particularly, if each horizontal resistive element and its corresponding switching transistor are considered a cell, then each such cell may be formed in a relatively small area thereby reducing the overall complexity and size of DAC 20, and gaining the benefits as known in the art which accompany the reduction in device size. In addition and as detailed later, in the preferred embodiment resistive elements R0 through R14 are formed as diffusion devices, thereby reducing overall power consumption. Still further, this choice also furthers a preferred layout because the resistive elements may then be formed in the same plane as the switching transistors. Lastly, note that the symmetry of DAC 20 is such that once a cell geometry is defined, it may be repeated for virtually all sets of taps and corresponding switching transistors in DAC 20, although some cells may require additional considerations by one skilled in the art such as those relating to a turn in meander 12'. Accordingly, since the use of horizontal resistive elements reduces cell size, and since the geometry is repeatable for a majority of DAC 20, then the overall DAC is improved due to the improvement of its fundamental cell.

Figure 3A:
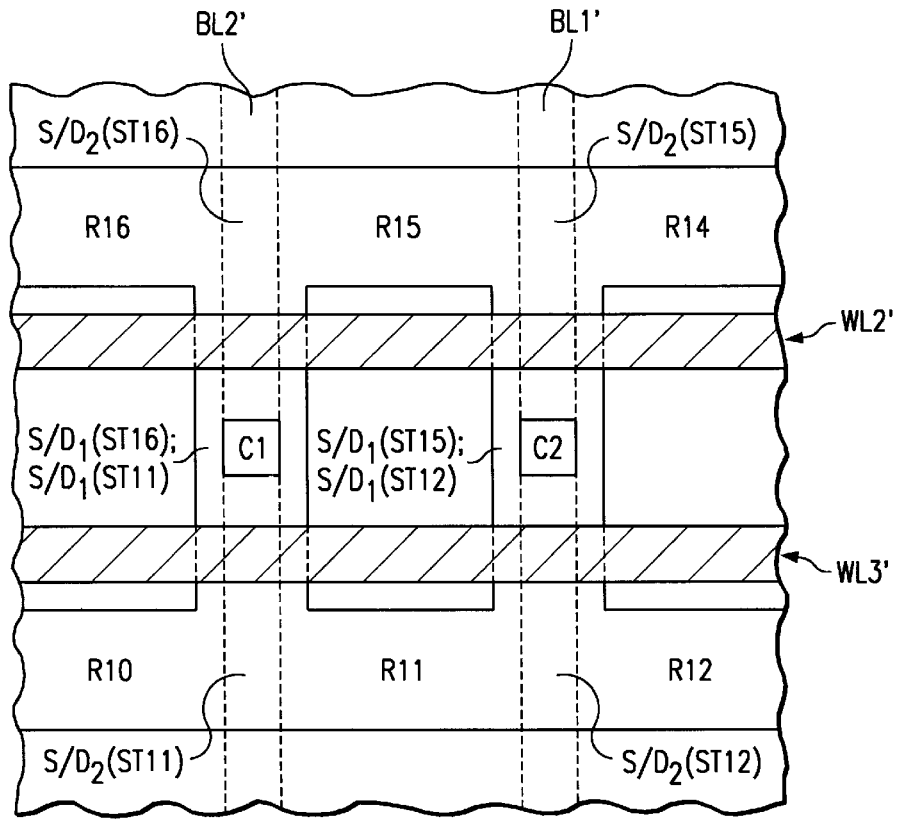
FIG. 3a illustrates a plan view of two cells from the DAC of FIG. 2.

Turning now to a second item of contrast between DAC 20 and DAC 10 of the prior art, another layout illustration revealed by FIG. 2 is the general orientation of the switching transistors, as well as their mutual connections. Before detailing this notion, note some comparable aspects of the switching transistors in DAC 20 with respect to those in DAC 10. In this regard, each word line WL0' through WL3' is connected to enable four switching transistors, which in the preferred embodiment are also n-channel transistors. For example, word line WL0' is connected to the gates of switching transistors ST25, ST24, ST23, and ST22, WL1' is connected to the gates of switching transistors ST18, ST19, ST20, and ST21, and so forth. For each switching transistor, one of its source/drains is connected to a corresponding tap, and the other source/drain is connected to a bit line, where the bit line is selected according to the column alignment of the tap. For example, switching transistor ST25 has one source/drain connected to tap T25 and another source/drain connected to bit line BL3'. Looking now to some distinctions relating to the switching transistors of DAC 20, note the orientation of each switching transistor is such that it is formed parallel to a bit line. Accordingly, as shown in FIG. 3a, below, in the preferred embodiment the source/drain regions of the switching transistors are parallel with the bit lines. Moreover, and although not precisely illustrated as such in FIG. 2 due to the schematic and two dimensional nature of the drawing, in the preferred embodiment the conductive paths of the switching transistors are co-linear with the bit lines, that is, one overlies the other. As another noteworthy matter, in the preferred embodiment meander 12' is spaced such that between each horizontal row of resistive elements are two switching transistors, with a first source/drain of one of those transistors connected to a corresponding voltage tap, and a second source/drain of those transistors connected to each other to form a mutual connection, where the mutual connection is further connected to the corresponding bit line. For example, looking to the two cells including taps T25 and T18, their respective switching transistors ST25 and ST18 have a mutual connection C7 between a source/drain of each transistor, and that connection C7 is further connected to bit line BL3'. In this regard, therefore, only a single contact or other electrical communication is required for these three different electrical items and, therefore, this aspect further reduces overall cell complexity and size.

The operation of DAC 20 is comparable in various respects to that of DAC 10 described earlier and, thus, is reviewed here with a lesser level of detail given the previous explanation of FIG. 1. Thus, decoders 14' and 16' respond to bits $I_0'$–$I_3'$ of the digital input word in the same general manner as DAC 10, whereby the two MSBs control column decoder 14' and the two LSBs, along with the lsb of the two MSBs, control row decoder 16' in combination with the logic provided by exclusive OR gates EOG0' and EOG1'. More specifically, therefore, row decoder 16' asserts one of word lines WL0' through WL3', thereby enabling the four switching transistors having their gate connected to that word line. Consequently, the taps to which those switching transistors are connected are provided a conductive path by those switching transistors to each of bit lines BL0' through BL3'. During an overlapping time period, column decoder 14' enables one of column access transistors CAT0' through CAT3' and the enabled one of those transistors passes the voltage along its corresponding bit line to $V_{OUT2}$.

Figure 3C:
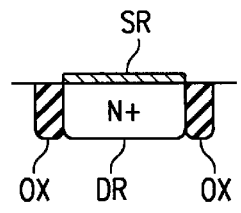
Figure 3B:
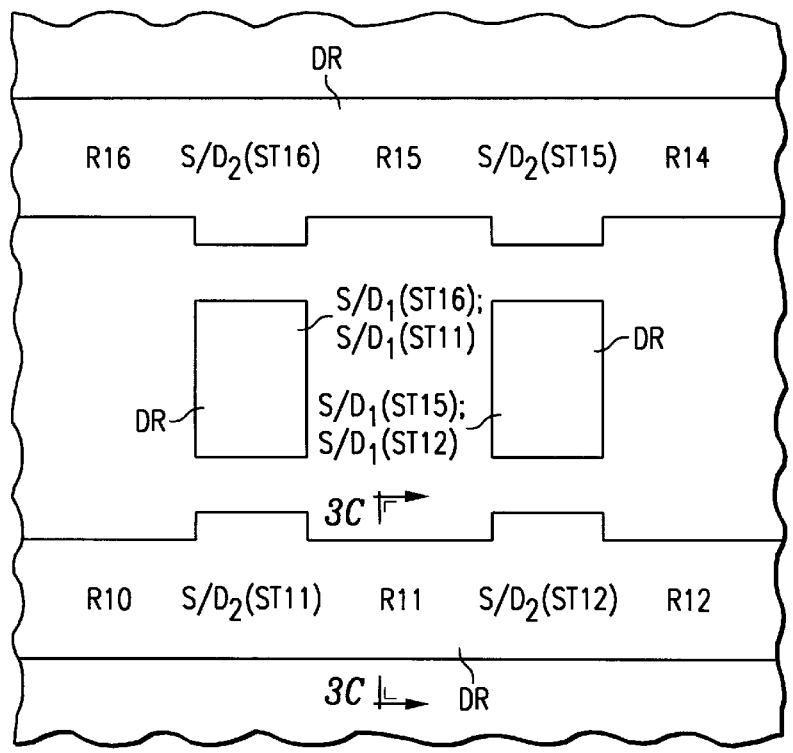

FIG. 3a illustrates a plan view of a few cells of DAC 20 to further demonstrate the preferred and compact design according to the preferred embodiment, and FIGS. 3b and 3c illustrate related views to further depict this design. Turning first then to FIG. 3a, its illustration includes the DAC cells for resistive element R15 with its corresponding switching transistor ST16 and resistive element R11 with its corresponding switching transistor ST12. Moreover, portions of adjacent cells are also shown and, thus, resistive elements R16, R14, R10, and R12 are shown in part. In any event and by way of example, therefore, resistive element R11 and its corresponding switching transistor ST11 are explored below, and from that discussion one skilled in the art will appreciate how various other cells in DAC 20 may be constructed in a same fashion.

Looking to resistive element R11 in the horizontal dimension of FIG. 3a, its formation is further appreciated by examining FIG. 3b. Specifically, FIG. 3b illustrates the same plan perspective as FIG. 3a, but before various manufacturing steps are complete in order to focus on a lower plane of the device. More particularly, FIG. 3b illustrates a plan view of a diffusion region designated generally as DR, where in the preferred embodiment region DR is formed by diffusing N+ dopants into a semiconductor device such as a semiconductor substrate. In an alternative embodiment, however, region DR could be formed as a p-type diffusion region (in an appropriate well or semiconductor substrate). In any event, by forming region DR, it forms the eventual regions for various different devices or device components, including resistive element R11. Moreover, FIG. 3c illustrates a cross-sectional view of resistive element R11. From this perspective, region DR forms the width of resistive element R11, and in the preferred embodiment is isolated on both sides by forming oxide regions OX in trenches adjacent each side of the resistive element, where such a formation is achieved using shallow trench technology. More particularly, the shallow trench technology is preferred because it assists in maintaining a uniform width for each resistive element and, in doing so, thereby increases the chance of maintaining the same resistance value for each of those elements. This may be in contrast to other isolating technologies, such as LOCOS, where lateral encroachment leads to reduced diffusion surface width and may make resistor matching more difficult. Lastly with respect to FIG. 3c, note that a silicide region SR is shown over diffusion region DR. In the preferred embodiment, such a region may be formed to further reduce the resistance of resistive element R11 (as well as the others) in which case the majority of the current passing through the device will pass through region SR.

Looking to the remainder of FIG. 3b, region DR also forms other devices or device components. More particularly, in the horizontal dimension region DR defines resistive elements R16, R15, R14, R10, and R12. Additionally, in the vertical dimension region DR provides source/drain regions for switching transistors ST11, ST16, ST15, and ST12. As a result, note two additional observations with respect to the switching transistors in the preferred embodiment. As a first observation, note that a portion of a diffused area in diffusion region DR which forms an end of a resistive element is effectively a shared diffusion region in that it also provides a source/drain for a switching transistor. For example, source/drain $S/D_2(ST16)$ of switching transistor 16 is the same diffused area as the ends of resistive elements R15 and R16. Accordingly, this shared region further reduces the size of each cell and, hence, the size of the DAC. As a second observation, note that a mutual diffusion area forms a source/drain for two different switching transistors; for example, the area forming a source/drain $S/D_1(ST16)$ for switching transistor ST16 also forms a source/drain S/D$_1$(ST11) for switching transistor ST11. As a result of this latter aspect, there are various benefits. For example, no additional electrical contact is requires between these two source/drains to achieve the electrical communication required by the schematic of FIG. 2. In addition, capacitance is reduced. Still further, the cell size is reduced as compared to a configuration where each switching transistor required an independent area to form its source/drain. As a final observation, since region DR forms both the resistive elements and the potential conductive paths for the switching transistors, each end of a resistive element, that is, each DAC tap, is also connected in this manner to a source/drain of its corresponding switching transistor without requiring an additional component to make this connection. For example, what is schematically shown as tap T11 on FIG. 2 corresponds in FIG. 3b (and 3a) to the mutual formation of region DR of source/drain S/D$_2$(ST11) and the left end of resistive element R11. As another example, what is schematically shown as tap T12 on FIG. 2 corresponds in FIG. 3b (and 3a) to the mutual formation of region DR of source/drain S/D$_2$(ST12) and the right end of resistive element R11. Once more, therefore, such an approach reduces device complexity as well as device size.

Returning to FIG. 3a, the remainder of switching transistor ST15 as well as the other devices therein may now be appreciated. First, after forming a sufficient gate oxide or the like (not shown), word line WL3' is formed in the horizontal dimension, thereby providing a gate structure for switching transistor ST15. At the same time, word line WL2' is formed, and both it and word line WL3' thereby provide gate structures for the other illustrated switching transistors. Thereafter, bit lines BL2' and BL1' are formed in the vertical dimension and, as seen in FIG. 3a, and as stated earlier, are therefore preferably co-aligned with the underlying source/drain regions of the switching transistors. Moreover, in the preferred embodiment, formation of the bit lines concurrently forms mutual connections C1 and C2. For example, before bit lines BL2' and BL1' are formed, vias may be formed to reach the first source/drain regions of switching transistors ST16, ST11, ST15, and ST12, and then bit lines BL2' and BL1' may be formed using metallization in which case the metal extends through the vias and forms electrical communications from these first source/drain regions to the corresponding bit line. As a result, and given the use of mutual source/drain regions between switching transistors that are vertically adjacent one another, only a single contact is required to connect one source/drain of one switching transistor, one source/drain of another switching transistors, and the corresponding bit line. Once more, therefore, device size and complexity are reduced.

From the above, it may be appreciated that the present embodiments provide numerous advantages over the prior art, many of which have been set forth above and additional ones of which will be ascertained by one skilled in the art For example, the preferred configurations may apply either to DACs or ADCs. In addition, while the present embodiments have been described in detail, various substitutions, modifications or alterations could be made to the descriptions set forth above without departing from the inventive scope. Indeed, some of these type of variations have been set forth above, and still others may be ascertained. For example, while resistor strings with relatively small numbers of resistors have been illustrated, the present teachings apply equally if not more beneficially to strings with larger numbers of resistors. Thus, the preceding as well as other ascertainable examples should further illustrate the inventive scope, where that scope is defined by the following claims.

What is claimed is:

1. A data converter, comprising:
   input for receiving a digital word;
   an output for providing an analog voltage level in response to the digital word;
   a plurality of bit lines formed with an alignment in a first dimension;
   a plurality of word lines formed with an alignment in a second dimension different than the first dimension;
   a string comprising a plurality of series connected resistive elements, wherein the string comprises a plurality of voltage taps, and wherein at least a majority of the plurality of series connected resistive elements are formed with an alignment in the second dimension; and
   a plurality of switching transistors coupled between the plurality of voltage taps and the output, wherein, responsive to at least a portion of the digital word, selected ones of the switching transistors are operable to receive a gate bias to enable a corresponding switching transistor to provide a conductive path from a corresponding one of the voltage taps toward one of the plurality of bit lines and further toward the output.

2. The data converter of claim 1 wherein the second dimension is orthogonal to the first dimension.

3. The data converter of claim 1 wherein all of the plurality of series connected resistive elements are formed with an alignment in the second dimension.

4. The data converter of claim 1 and further comprising a semiconductor substrate, wherein each of the plurality of series connected resistive elements comprises a diffusion region in the semiconductor substrate.

5. The data converter of claim 4 wherein the diffusion region comprises an N type semiconductor diffusion region.

6. The data converter of claim 4 wherein the diffusion region comprises a P type semiconductor diffusion region.

7. The data converter of claim 4:
   wherein each of the plurality of switching transistors has a first and second source/drain region; and
   wherein the first and second source/drain region of each of the plurality of switching transistors are formed as diffusion regions in the semiconductor substrate.

8. The data converter of claim 7 wherein each of the plurality of switching transistors are formed with an alignment in the first dimension.

9. The data converter of claim 8 wherein for each pair of switching transistors in the plurality of switching transistors, a source/drain of a first switching transistor in the pair has a same diffusion region area as a source/drain of a second switching transistor in the pair.

10. The data converter of claim 8 wherein for each switching transistor in the plurality of switching transistors the diffusion region forming one source/drain of the switching transistor is shared with a portion of the diffusion region forming one of the plurality of resistive elements.

11. The data converter of claim 7 wherein each of the diffusion regions of the series connected resistive elements and of the switching transistors comprises an N type semiconductor diffusion region.

12. The data converter of claim 7 wherein each of the diffusion regions of the series connected resistive elements and of the switching transistors comprises a P type semiconductor diffusion region.

13. The data converter of claim 4 wherein each of the plurality of series connected resistive elements further comprises a silicide region adjacent the diffusion region.

14. The data converter of claim 1 wherein each of the plurality of switching transistors are formed with an alignment in the first dimension.

15. The data converter of claim 1:

wherein the string comprising a plurality of series connected resistive elements comprises a meander having at least a first row and a second row of resistive elements aligned in parallel in the second dimension and having a turn therebetween;

wherein the plurality of switching transistors comprises a first and second set of switching transistors formed between the first row and the second row of resistive elements;

wherein each switching transistor in the first set has one source/drain coupled to a corresponding one of the plurality of voltage taps;

wherein each switching transistor in the second set has one source/drain coupled to a corresponding one of the plurality of voltage taps; and wherein each switching transistor in the first set has another source/drain coupled to another source/drain of a corresponding switching transistor in the second set.

16. The data converter of claim 15 and further comprising a single contact coupled to each corresponding connection of a source/drain of a switching transistor in the first set with a source/drain of a switching transistor in the second set, wherein the contact is further connected to a corresponding one of the plurality of bit lines.

17. The data converter of claim 1:

and further comprising a semiconductor substrate;

wherein each of the plurality of series connected resistive elements comprises a diffusion region in the semiconductor substrate;

wherein each of the plurality of switching transistors has a first and second source/drain region;

wherein the first and second source/drain region of each of the plurality of switching transistors are formed as diffusion regions in the semiconductor substrate;

wherein the string comprising a plurality of series connected resistive elements comprises a meander having at least a first row and a second row of resistive elements aligned in parallel in the second dimension and having a turn therebetween;

wherein the plurality of switching transistors comprises a first and second set of switching transistors formed between the first row and the second row of resistive elements;

wherein each switching transistor in the first set has one source/drain coupled to a corresponding one of the plurality of voltage taps;

wherein each switching transistor in the second set has one source/drain coupled to a corresponding one of the plurality of voltage taps; and wherein each switching transistor in the first set has another source/drain coupled to another source/drain of a corresponding switching transistor in the second set.

18. The data converter of claim 17 and further comprising a single contact coupled to each corresponding connection of a source/drain of a switching transistor in the first set with a source/drain of a switching transistor in the second set, wherein the contact is further connected to a corresponding one of the plurality of bit lines.

19. A data converter formed using a semiconductor substrate, comprising:

an input for receiving a digital word;

an output for providing an analog voltage level in response to the digital word;

a plurality of bit lines formed with an alignment in a first dimension;

a plurality of word lines formed with an alignment in a second dimension orthogonal to the first dimension;

a string comprising a plurality of series connected resistive elements, wherein the string comprises a plurality of voltage taps, wherein at least a majority of the plurality of series connected resistive elements are formed with an alignment in the second dimension, and wherein each of the plurality of series connected resistive elements comprises a diffusion region in the semiconductor substrate;

a plurality of switching transistors coupled between the plurality of voltage taps and the output and formed with an alignment in the first dimension, wherein, responsive to at least a portion of the digital word, selected ones of the switching transistors are operable to receive a gate bias to enable a corresponding switching transistor to provide a conductive path from a corresponding one of the voltage taps toward one of the plurality of bit lines and further toward the output, wherein each of the plurality of switching transistors has a first and second source/drain region, wherein the first and second source/drain region of each of the plurality of switching transistors are formed as diffusion regions in the semiconductor substrate;

wherein for each pair of switching transistors in the plurality of switching transistors, a source/drain of a first switching transistor in the pair has a same diffusion region area as a source/drain of a second switching transistor in the pair;

wherein the string comprising a plurality of series connected resistive elements comprises a meander having at least a first row and a second row of resistive elements aligned in parallel in the second dimension and having a turn therebetween;

wherein the plurality of switching transistors comprises a first and second set of switching transistors formed between the first row and the second row of resistive elements;

wherein each switching transistor in the first set has a source/drain coupled to a corresponding one of the plurality of voltage taps; and wherein each switching transistor in the second set has a source/drain coupled to a corresponding one of the plurality of voltage taps.

20. The data converter of claim 19 wherein each of the plurality of series connected resistive elements further comprises a silicide region adjacent the diffusion region.

21. The data converter of claim 19 and further comprising a single contact coupled to each of the same diffusion regions.

* * * * *